United States Patent
Park et al.

(10) Patent No.: US 10,028,386 B2
(45) Date of Patent: Jul. 17, 2018

(54) COMPOSITE ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Heung Kil Park, Suwon-si (KR); Jong Hwan Park, Suwon-si (KR); Young Ghyu Ahn, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/297,865

(22) Filed: Oct. 19, 2016

(65) Prior Publication Data
US 2017/0273184 A1    Sep. 21, 2017

(30) Foreign Application Priority Data
Mar. 21, 2016    (KR) .................. 10-2016-0033215

(51) Int. Cl.
| | |
|---|---|
| H01G 4/38 | (2006.01) |
| H05K 1/18 | (2006.01) |
| H01G 4/005 | (2006.01) |
| H01G 4/018 | (2006.01) |
| H01G 4/228 | (2006.01) |
| H01G 4/30 | (2006.01) |
| H01G 9/042 | (2006.01) |
| H01G 9/08 | (2006.01) |

(Continued)

(52) U.S. Cl.
CPC ............ *H05K 1/181* (2013.01); *H01G 4/005* (2013.01); *H01G 4/018* (2013.01); *H01G 4/228* (2013.01); *H01G 4/30* (2013.01); *H01G 9/042* (2013.01); *H01G 9/08* (2013.01); *H01G 15/00* (2013.01); *H05K 1/0243* (2013.01); *H05K 1/111* (2013.01); *H05K 2201/10015* (2013.01); *H05K 2201/2045* (2013.01)

(58) Field of Classification Search
CPC ............. H01G 4/38; H01G 4/385; H01G 4/30
USPC .................................... 361/328–329
See application file for complete search history.

(56) References Cited

U.S. PATENT DOCUMENTS

| | | |
|---|---|---|
| 2007/0211414 A1 | 9/2007 | Pelcak et al. |
| 2008/0080124 A1* | 4/2008 | Kim .................. H01G 9/012 361/529 |
| 2016/0049252 A1 | 2/2016 | Park et al. |

FOREIGN PATENT DOCUMENTS

| | | |
|---|---|---|
| JP | 01091411 A * | 4/1989 |
| JP | 1997-232196 A | 9/1997 |

(Continued)

OTHER PUBLICATIONS

Notice of Office Action dated Apr. 11, 2017, in corresponding Korean Patent Application No. 10-2016-0033215, with English language translation.

*Primary Examiner* — Eric Thomas
(74) *Attorney, Agent, or Firm* — McDermott Will & Emery LLP

(57) ABSTRACT

A composite electronic component includes a multilayer capacitor; a tantalum capacitor; a lead frame disposed between the multilayer capacitor and the tantalum capacitor and electrically connecting the multilayer capacitor and the tantalum capacitor to each other; and an encapsulation member encapsulating the multilayer capacitor and the tantalum capacitor so that a portion of the lead frame is exposed.

17 Claims, 7 Drawing Sheets

(51) Int. Cl.
*H01G 15/00* (2013.01)
*H05K 1/02* (2006.01)
*H05K 1/11* (2006.01)

(56) References Cited

FOREIGN PATENT DOCUMENTS

| | | | |
|---|---|---|---|
| JP | 10073610 A | * | 3/1998 |
| JP | 2000173860 A | * | 6/2000 |
| JP | 2001-332446 A | | 11/2001 |
| JP | 2007-273996 A | | 10/2007 |
| JP | 2008-187091 A | | 8/2008 |
| KR | 10-2014-0143340 A | | 12/2014 |

* cited by examiner

US 10,028,386 B2

COMPOSITE ELECTRONIC COMPONENT AND BOARD HAVING THE SAME

CROSS-REFERENCE TO RELATED APPLICATION(S)

This application claims the benefit of priority to Korean Patent Application No. 10-2016-0033215, filed on Mar. 21, 2016 in the Korean Intellectual Property Office, the entirety of which is incorporated herein by reference.

TECHNICAL FIELD

The present disclosure relates a composite electronic component and a board having the same.

BACKGROUND

A decoupling capacitor is commonly provided in a power supply circuit, such as a large scale integrated circuit(LSI).

The decoupling capacitor may be charged and discharged to serve to suppress variations in a power supply voltage of the LSI and ensure stable performance of the LSI.

Recent increases in the multifunctionalization and increased integration of LSI circuits have led to increased amounts of current consumption, and overcurrents maybe rapidly generated in power supply circuits due to an increase in a driving frequency, such that there has been a demand for an increase in the capacitance of a decoupling capacitor and a decrease in the equivalent series inductance (ESL) of the decoupling capacitor.

In addition, in accordance with demand for the miniaturization of an electronic component due to portability of an information communications device, demand for a high performance decoupling capacitor has increased.

SUMMARY

An aspect of the present disclosure provides a composite electronic component having direct current (DC)-bias characteristics, stable temperature characteristics, a low equivalent series inductance (ESL) and a low equivalent series resistance (ESR), while having decreased high frequency impedance, and a board having the same.

According to an aspect of the present disclosure, a composite electronic component may be formed as a single electronic component by encapsulating a multilayer capacitor disposed adjacently to a mounting surface and a tantalum capacitor disposed above the multilayer capacitor in a state in which the multilayer capacitor and the tantalum capacitor are electrically connected to each other by a lead frame.

According to another aspect of the present disclosure, a board having a composite electronic component may include: a substrate having electrode pads disposed on an upper surface thereof; and the composite electronic component installed on the substrate, where the electrode pads and a lead frame of the composite electronic component are connected to each other by solders.

BRIEF DESCRIPTION OF THE DRAWINGS

The above and other aspects, features, and advantages of the present disclosure will be more clearly understood from the following detailed description taken in conjunction with the accompanying drawings, in which.

DETAILED DESCRIPTION

Figure 1:
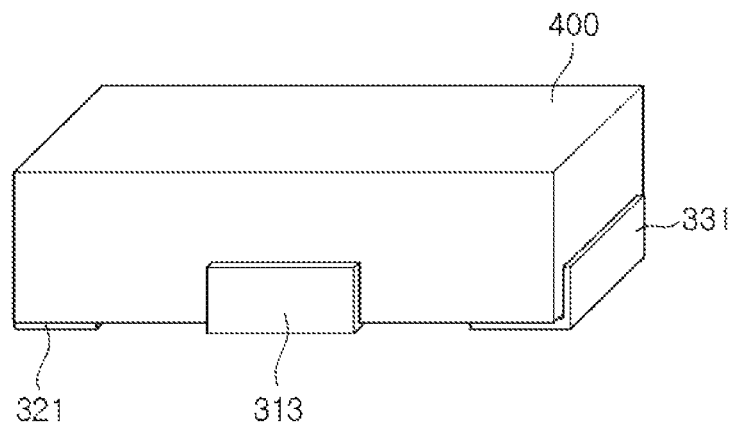
FIG. 1 is a perspective view illustrating a composite electronic component according to an exemplary embodiment in the present disclosure.

Hereinafter, exemplary embodiments in the present disclosure will be described in detail with reference to the accompanying drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on, " "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below, " and "lower" and the like, may be used herein for ease of description to describe one element's relationship relative to another element (s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a, " "an, " and "the" are intended to include the plural forms as well, unless the context clearly indicates otherwise. It will be further understood that the terms "comprises, " and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Directions of a hexahedron will be defined in order to clearly describe exemplary embodiments in the present disclosure. L, W and T, illustrated in the accompanying drawings, refer to a length direction, a width direction, and a thickness direction, respectively.

Composite Electronic Component

Hereinafter, exemplary embodiments in the present disclosure will be described with reference to the accompanying drawings.

Figure 2:
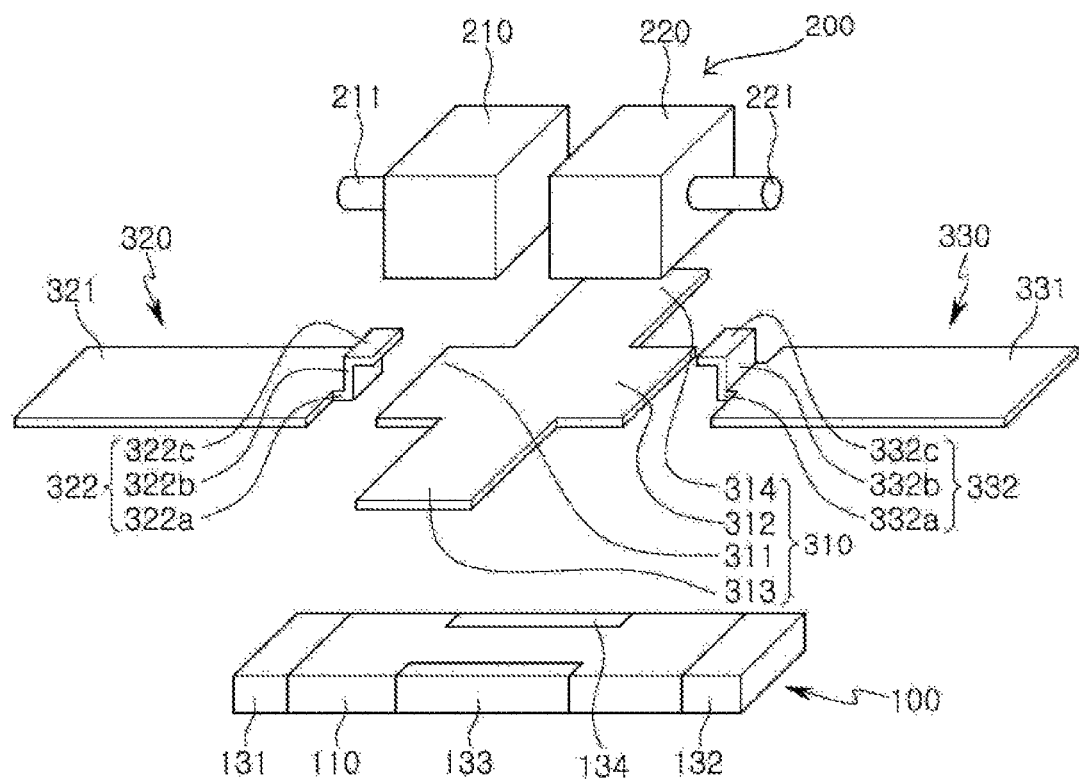
FIG. 2 is an exploded perspective view illustrating the components of the composite electronic component of FIG. 1 before a lead frame is bent in a state in which an encapsulation member is not shown.
Figure 3:
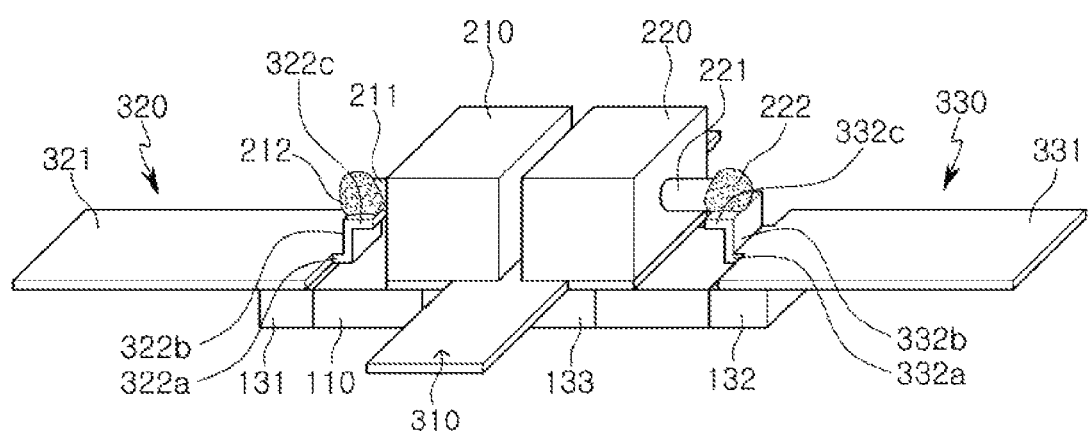
FIG. 3 is an assembled perspective view of FIG. 2.
Figure 4:
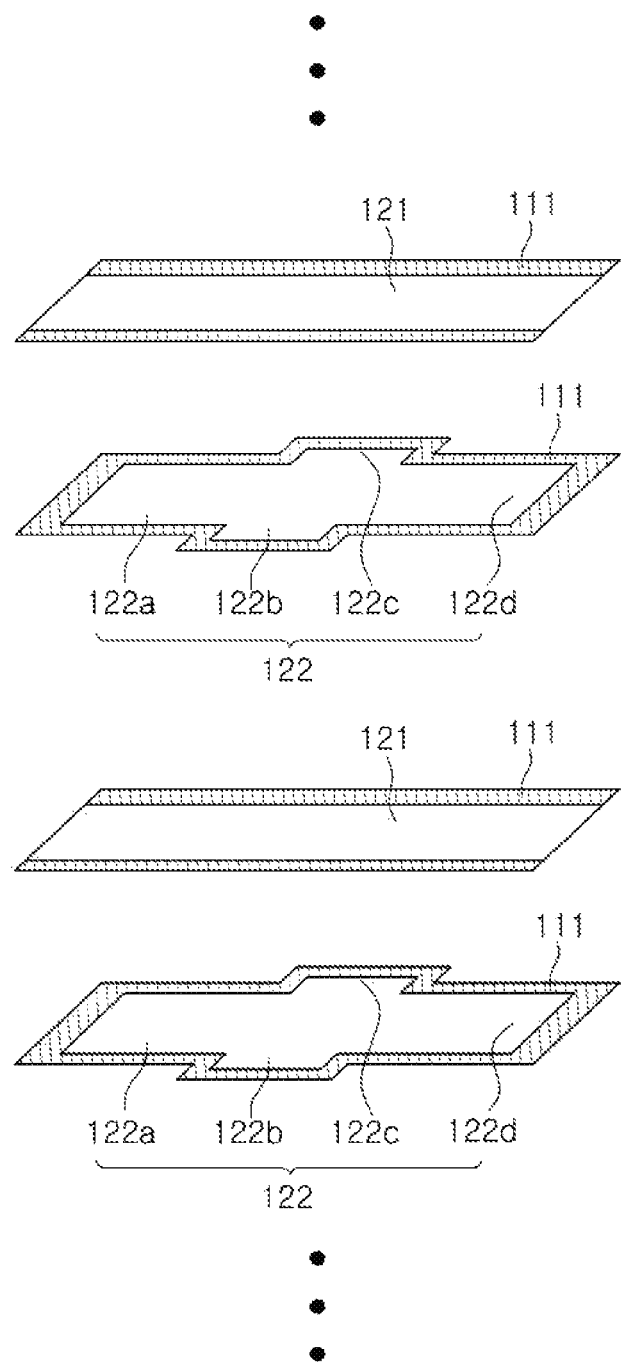
FIG. 4 is an exploded perspective view illustrating structures of first and second internal electrodes of the multilayer capacitor of the composite electronic component according to an exemplary embodiment in the present disclosure.

FIG. 1 is a perspective view illustrating a composite electronic component according to an exemplary embodiment in the present disclosure; FIG. 2 is an exploded perspective view illustrating the components of the composite electronic component of FIG. 1 before a lead frame is bent in a state in which an encapsulation member is not shown; FIG. 3 is an assembled perspective view of FIG. 2; and FIG. 4 is an exploded perspective view illustrating structures of first and second internal electrodes of the multilayer capacitor of the composite electronic component according to an exemplary embodiment in the present disclosure.

Referring to FIGS. 1 through 4, a composite electronic component 10 according to an exemplary embodiment in the present disclosure may include a multilayer capacitor 100, a tantalum capacitor 200, lead frames 310, 320, and 330, and an encapsulation member 400.

The multilayer capacitor 100 may include a body 110 and first to fourth external electrodes 131 to 134.

The body 110 may be formed by stacking a plurality of dielectric layers 111 and first and second internal electrodes 121 and 122 alternately disposed with respective dielectric layers 111 interposed therebetween in a thickness direction and then sintering the plurality of dielectric layers 111 and the first and second internal electrodes 121 and 122.

Here, the body 110 may have an approximately hexahedral shape having a first surface (a lower surface) and a second surface (an upper surface) opposing each other in the thickness direction, third and fourth surfaces opposing each other in a length direction, and fifth and sixth surfaces opposing each other in a width direction.

The dielectric layer 111 may contain ceramic powders having a high k, for example, barium titanate ($BaTiO_3$)-based powders or strontium titanate ($SrTiO_3$)-based powders. However, a material of the dielectric layer 111 is not limited thereto.

As shown in FIG. 4, the first internal electrodes 121 may have both ends exposed through the third and fourth surfaces of the body 110 in the length direction, and the second internal electrodes 122 may have portions exposed through the fifth and sixth surfaces of the body 110 in the width direction.

Here, a material of the first and second internal electrodes 121 and 122 is not particularly limited, but may be a conductive paste formed of one or more selected from the group consisting of, for example, a noble metal such as palladium (Pd), a palladium-silver (Pd—Ag) alloy, or the like, or a transitional metal such as nickel (Ni) or copper (Cu).

The first and second external electrodes 131 and 132 may be disposed on first and second end portions of the body 110 in the length direction, respectively. Here, the first and second external electrodes 131 and 132 may extend from the third and fourth surfaces of the body 110 in the length direction onto a portion or portions of the first or second surface of the body 110 in the thickness direction, respectively.

The first and second external electrodes 131 and 132 may be disposed to cover the third and fourth surfaces of the body 110, respectively, to thereby be electrically connected to both exposed end portions of the first internal electrodes 121, respectively.

The third and fourth external electrodes 133 and 134 may be disposed on both end portions of the body 110 in the width direction, respectively. Here, the third and fourth external electrodes 133 and 134 may extend from the fifth and sixth surfaces of the body 110 in the width direction onto a portion or portions of the first or second surface of the body 110 in the thickness direction, respectively.

The third and fourth external electrodes 133 and 134 may be disposed to cover portions of the fifth and sixth surfaces of the body 110, respectively, to thereby be electrically connected to both exposed end portions of the second internal electrodes 122, respectively.

According to an exemplary embodiment in the present disclosure, nickel/tin (Ni/Sn) plating layers may not be disposed on the first to fourth external electrodes 131 to 134 unlike a general multilayer capacitor.

Since the composite electronic component according to the present exemplary embodiment includes the encapsulation member 400 disposed to enclose a composite body including the multilayer capacitor 100 and the tantalum capacitor 200 as described below, a separate plating layer does not need to be formed on the first to fourth external electrodes 131 to 134 of the multilayer capacitor 100.

That is, even though the plating layer is not formed on the external electrodes, a problem in which reliability is decreased due to permeation of a plating solution into the body 110 of the multilayer capacitor 100 does not occur.

The tantalum capacitor 200 may include a tantalum body and a tantalum wire of which a portion is embedded in the tantalum body.

A portion of the tantalum wire may be embedded in the tantalum body, and the other portion of the tantalum wire may protrude to be exposed through one surface of the tantalum body.

In the present exemplary embodiment, the tantalum capacitor 200 may be disposed so that the tantalum body is positioned above the second surface (the upper surface) of the body 110 of the multilayer capacitor 100 in the thickness direction.

In the present exemplary embodiment, the tantalum body of the tantalum capacitor may include first and second tantalum bodies 210 and 220 disposed to be spaced apart from each other in the length direction of the multilayer capacitor 100.

In addition, first and second tantalum wires 211 and 221 may each protrude through surfaces of the first and second tantalum bodies 210 and 220 opposing each other in the length direction of the body 110.

However, the tantalum capacitor is not limited thereto.

That is, the number of tantalum bodies of the tantalum capacitor may be one or more.

For example, the first and second tantalum wires may each protrude through surfaces of one tantalum body opposing each other in the length direction.

The first and second tantalum bodies 210 and 220 may contain a tantalum powder sintered material.

The lead frames may be disposed between the multilayer capacitor 100 and the tantalum capacitor 200 to serve to electrically connect the multilayer capacitor 100 and the tantalum capacitor 200 to each other, and may include first, second, and third lead frames 320, 330, and 310.

The first and second lead frames 320 and 330 may be positioned on respective band portions of the first and second external electrodes 131 and 132 formed on the second surface of the body 110 to thereby be electrically connected to the first and second external electrodes 131 and 132, respectively, and one end portion of the first and second lead frames 320 and 330 may be connected to the first and second tantalum wires 211 and 221, respectively.

Here, the first and second lead frames 320 and 330 may include first and second terminal portions 321 and 331 of which portions are led to the exterior of an encapsulation member 400 to be described below and first and second connection portions 322 and 332 formed at one end portion of the first and second terminal portions 321 and 331, respectively.

The first and second connection portions 322 and 332 may include first and second lower horizontal portions 322a and 332a, first and second upper horizontal portions 322c and 332c contacting the first and second tantalum wires 211 and 221, and first and second vertical portions 322b and 332b connecting the first and second lower horizontal portions 332a and 332a and the first and second upper horizontal portions 322c and 332c to each other, respectively.

Here, bonding portions 212 and 222 may be provided to bond the first and second upper horizontal portions 322c and 332c and the first and second tantalum wires 211 and 221 to each other. The bonding portions 212 and 222 may be formed of a solder, a conductive adhesive, or the like.

Third and fourth terminal portions 313 and 314 of the third lead frame 310 led to the exterior of an encapsulation member 400 to be described below may be connected to each other in a state in which they contact the band portions of the third and fourth external electrodes 133 and 134, respectively, to thereby be simultaneously connected to the third and fourth external electrodes 133 and 134, and each of the first and second tantalum bodies 210 and 220 may be mounted on the third lead frame 310.

Here, the third lead frame 310 may have first and second extension portions 311 and 312 so as to extend contact areas between the third lead frame 310 and the first and second tantalum bodies 210 and 220, respectively.

The encapsulation member 400 may encapsulate the multilayer capacitor 100 and the tantalum capacitor 200 so as to be sealed from the outside, and be formed so that some of the first to fourth terminal portions 321, 331, 313, and 314 of the first, second, and third lead frames 320, 330, and 310 are exposed to the outside.

Here, the encapsulation member 400 may serve to protect the multilayer capacitor 100 and the tantalum capacitor 200 from an external environment.

The encapsulation member 400 may be formed of, for example, an epoxy or silica-based epoxy molding compound (EMC), or the like, but is not limited thereto.

In addition, conductive adhesive layers (not illustrated) may be disposed between the respective lead frames and the external electrodes and between the lead frames and the tantalum bodies.

The conductive adhesive layer may be, for example, a conductive resin paste or a high temperature solder, but is not limited thereto.

Figure 5:
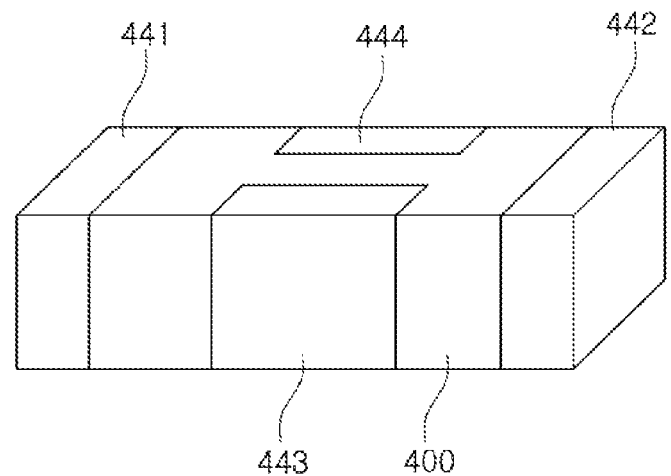
FIG. 5 is a perspective view illustrating a composite electronic component according to another exemplary embodiment in the present disclosure.

As illustrated in FIG. 5, first to fourth terminal electrodes 441 to 444 may be formed on the first to fourth terminal portions 321, 331, 313, and 314 led to the exterior of the encapsulation member 400.

Here, the first and second terminal electrodes 441 and 442 may be extended from both surfaces of the encapsulation member 400 in the length direction onto a portion or portions of both surfaces of the encapsulation member 400 in the thickness direction and portions of both surfaces of the encapsulation member 400 in the width direction.

The third and fourth terminal electrodes 443 and 444 may be extended from both surfaces of the encapsulation member 400 in the width direction onto a portion or portions of both surfaces of the encapsulation member 400 in the thickness direction.

The first to fourth terminal electrodes 441 to 444 may be formed of a conductive paste, and plating may be performed on surfaces of the first to fourth terminal electrodes 441 to 444 in order to improve bonding properties between the first to fourth terminal electrodes 441 to 444 and a solder at the time of mounting the composite electronic component on a board.

When the first to fourth terminal electrodes 441 to 444 are formed on the encapsulation member 400 as described above, a structure of the composite electronic component may become a vertically symmetrical structure, such that directivity of a product may be removed at the time of mounting the composite electronic component on the board.

In the present exemplary embodiment, the multilayer capacitor was disposed and illustrated from below in order to utilize a wide upper surface of the multilayer capacitor as a support surface supporting the lead frames and the tantalum capacitor at the time of manufacturing a product.

When directions are set so that the multilayer capacitor is disposed at an upper side and the tantalum capacitor is directed toward the board at the time of mounting the composite electronic component according to the present exemplary embodiment, a phenomenon in which piezoelectric vibrations of the multilayer capacitor are directly transferred to the board may be blocked, such that a decrease in acoustic noise may be expected.

As described above, the composite electronic component according to an exemplary embodiment in the present disclosure may be implemented as one component in which the multilayer capacitor 100 and the tantalum capacitor 200 are coupled to each other and encapsulated by the encapsulation member 400.

In addition, a capacitance of the composite electronic component may be increased, and the multilayer capacitor 100 may be positioned adjacently to the board at the time of mounting the composite electronic component on the board, such that an equivalent series inductance (ESL) may be decreased.

Therefore, a rapid change in a current flowing to a power supply circuit such as a large scale integrated circuit (LSI) and variations in a voltage generated by a wiring inductance in a power supply circuit such as the LSI may be absorbed to stabilize a power supply voltage.

In addition, elastic force of the lead frames may absorb the piezoelectric vibrations of the multilayer capacitor 100 to decrease vibrations of the board and acoustic noise at the time of mounting the composite electronic component on the board.

In the present exemplary embodiment, the multilayer capacitor 100 including the body 110, the first and second external electrodes 131 and 132 disposed on first and second end portions of the body 110 in the length direction, respectively, and the third and fourth external electrodes 133 and 134 disposed on first and second end portions of the body 110 in the width direction, respectively, may be disposed adjacently to a mounting surface at the time of mounting the composite electronic component on the board to decrease a high frequency impedance, thereby decreasing variations in a voltage or high frequency noise.

In addition, in the present exemplary embodiment, the tantalum capacitor having high capacitance volume efficiency and the multilayer capacitor may be coupled to each other to form a single composite electronic component to realize high capacitance and low ESL and effectively cope with miniaturization.

Since the tantalum capacitor is formed of a paraelectric dielectric material, DC-bias characteristics and temperature characteristics of the tantalum capacitor may be stable, but an ESL and an equivalent series resistance (ESR) of the tantalum capacitor may be high, such that an impedance of the tantalum capacitor is not decreased at a high frequency.

The multilayer capacitor may have excellent high frequency characteristics, but a capacitance of the multilayer capacitor may be decreased depending on DC-bias characteristics and temperature characteristics.

Since a decoupling capacitor used in the power supply circuit such as the LSI absorbs a rapid change in a current flowing to the LSI and variations in a voltage generated by a wiring inductance to stabilize a power supply voltage, a capacitance of the decoupling capacitor needs to be large and an ESL of the decoupling capacitor needs to be small.

Therefore, according to the present exemplary embodiment, through a structure of the composite electronic component in which the multilayer capacitor and the tantalum capacitor are coupled to each other, disadvantages of the multilayer capacitor and the tantalum capacitor may offset each other, and the decoupling capacitor having a stable capacitance and excellent high frequency characteristics may be provided.

The tantalum capacitor may implement a high capacitance and excellent DC-bias characteristics, and does not generate acoustic noise at the time of being mounted on the board, but has a high ESR, as described above.

The multilayer capacitor has low ESR and low ESL, but has a disadvantage in that its DC-bias characteristics are no better than those of the tantalum capacitor and its capacitance is lower than that of the tantalum capacitor.

Since the composite electronic component according to the present exemplary embodiment includes a composite body in which the multilayer capacitor and the tantalum capacitor are coupled to each other, high ESR, which is a disadvantage of the tantalum capacitor, may be avoided, and deterioration of DC-bias characteristics, which is a disadvantage of the multilayer capacitor, may be prevented.

Modified Examples

Figure 6:
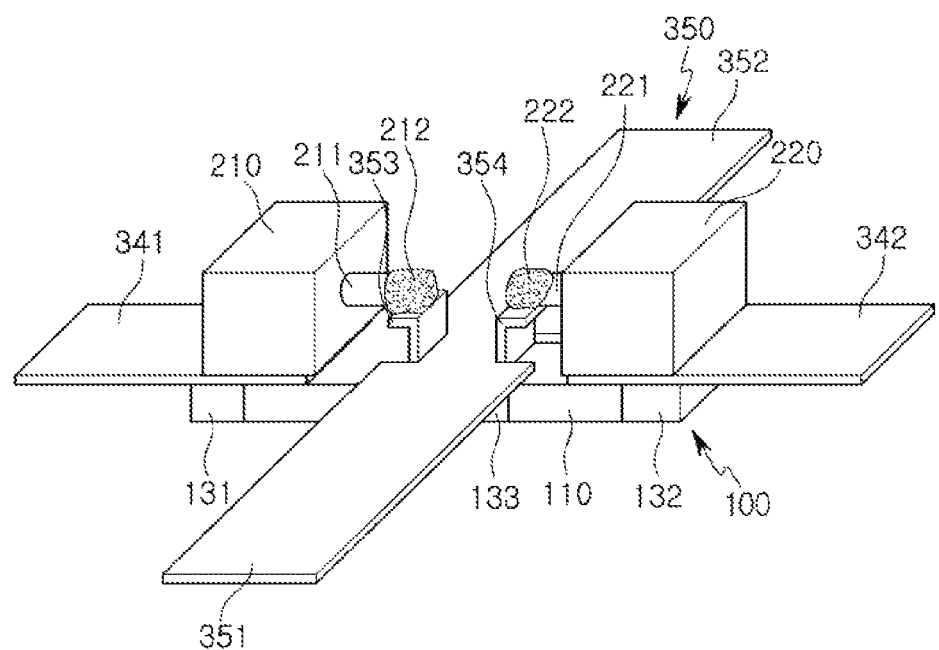
FIG. 6 is a perspective view illustrating the components of the composite electronic component according to another exemplary embodiment in the present disclosure before a lead frame is bent in a state in which an encapsulation member is not shown.

FIG. 6 is a perspective view illustrating a shape of the composite electronic component according to another exemplary embodiment in the present disclosure before a lead frame is bent in a state in which an encapsulation member is not shown.

Here, since structures of the multilayer capacitor and the encapsulation member are similar to those of the multilayer capacitor and the encapsulation member according to the exemplary embodiment described above, a detailed description therefor will be omitted in order to avoid an overlapped description, and first to third lead frames and a tantalum capacitor having structures different from those of the first to third lead frames and the tantalum capacitor according to the exemplary embodiment described above will be illustrated and described in detail.

Referring to FIG. 6, first and second lead frames 341 and 342 according to the present exemplary embodiment may be disposed on an upper surface of a multilayer capacitor 100 so as to be connected to first and second external electrodes 131 and 132, respectively.

A third lead frame 350 may be disposed on the upper surface of the multilayer capacitor 100 and may connect the third and fourth external electrodes 133 and 134 to each other.

The tantalum capacitor may include first and second tantalum bodies 210 and 220 disposed to be spaced apart from each other in the length direction of the multilayer capacitor 100.

The first and second tantalum bodies 210 and 220 may be mounted on the first and second lead frames 341 and 342, respectively. Here, conductive adhesive layers (not illustrated) maybe disposed between lower surfaces of the first and second tantalum bodies 210 and 220 and upper surfaces of the first and second lead frames 341 and 342, respectively.

First and second tantalum wires 211 and 221 may protrude through surfaces of the first and second tantalum bodies 210 and 220 facing each other in the length direction, respectively. Here, third and fourth connection portions 353 and 354 may be formed at the third lead frame 350 so as to protrude upwardly in order to be connected to the first and second tantalum wires 211 and 221, respectively.

Here, the third and fourth connection portions 353 and 354 and the first and second tantalum wires 211 and 222 may be adhered to each other by bonding portions 212 and 222, respectively.

Figure 7A:
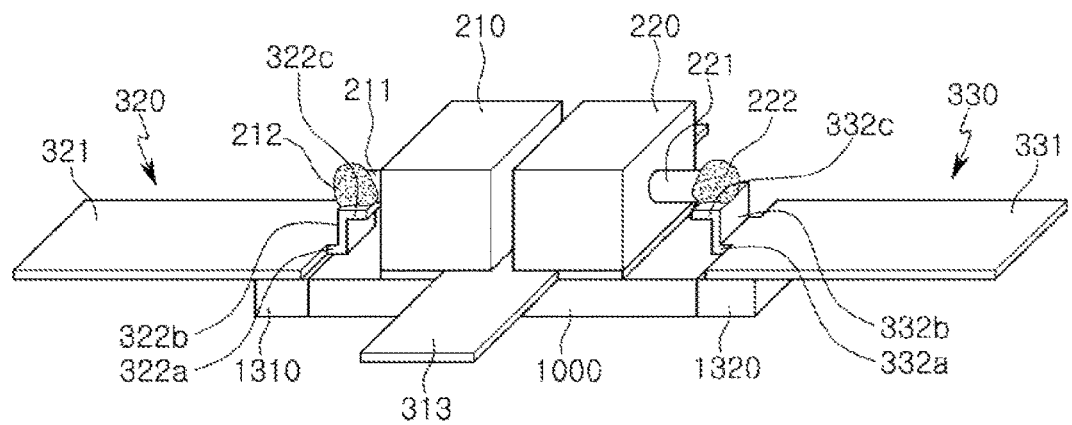
FIGS. 7A and 7B are perspective views illustrating the components of the composite electronic component according to other exemplary embodiments in the present disclosure before a lead frame is bent in a state in which an encapsulation member is not shown.
Figure 8:
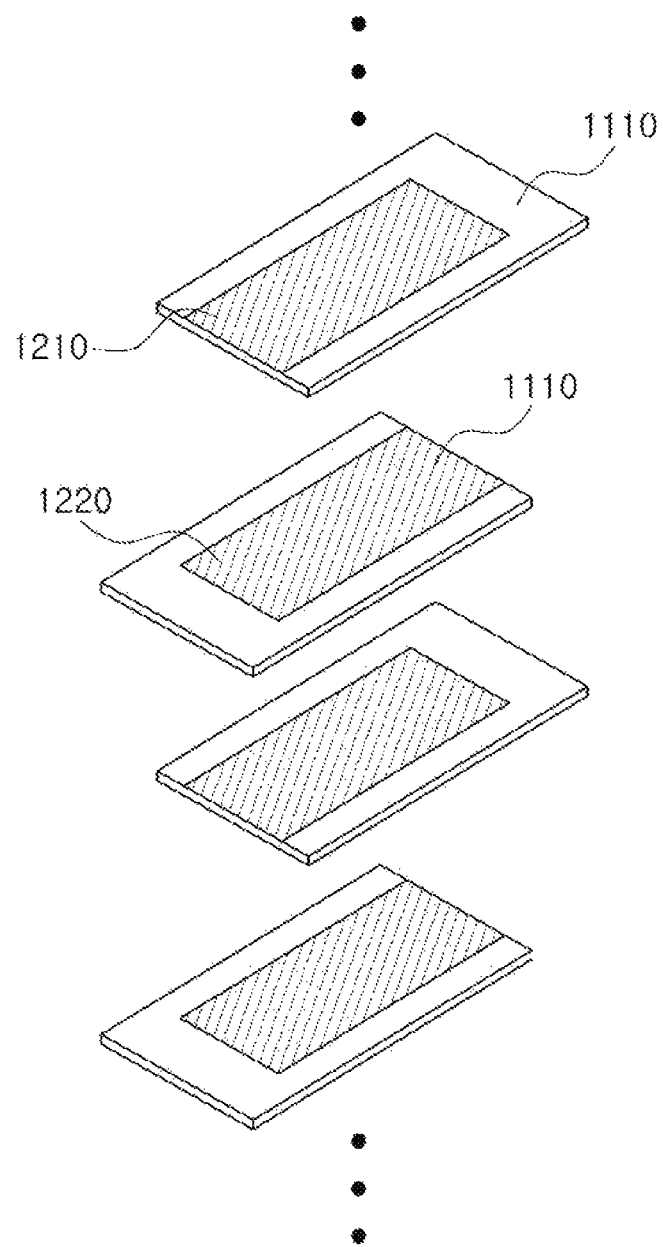
FIG. 8 is an exploded perspective view illustrating structures of first and second internal electrodes of the multilayer capacitor of the composite electronic component shown in FIGS. 7A and 7B.

FIG. 7A is a perspective view illustrating a shape of the composite electronic component according to another exemplary embodiment in the present disclosure before a lead frame is bent in a state in which an encapsulation member is not shown; and FIG. 8 is an exploded perspective view illustrating structures of first and second internal electrodes of a body 1000 of a multilayer capacitor shown in FIG. 7A.

Here, since structures of a tantalum capacitor, lead frames, and an encapsulation member are similar to those of the tantalum capacitor, the lead frames, and the encapsulation member according to the exemplary embodiment described above, a detailed description thereof will be omitted in order to avoid an overlapped description, and a multilayer capacitor having a structure different from that of the multilayer capacitor according to the exemplary embodiment described above will be illustrated and be described in detail.

Referring to FIGS. 7A and 8, a body 1000 of a multilayer capacitor according to the present exemplary embodiment may include a plurality of dielectric layers 1110 stacked in the thickness direction and first and second internal electrodes 1210 and 1220 disposed to be alternately exposed to third and fourth surfaces of the body 1000 in the length direction with respective dielectric layers 111 interposed therebetween.

In the present exemplary embodiment, since the multilayer capacitor does not include third and fourth external electrodes, a third lead frame may serve to electrically connect first and second tantalum bodies 210 and 220 to each other.

Figure 7B:
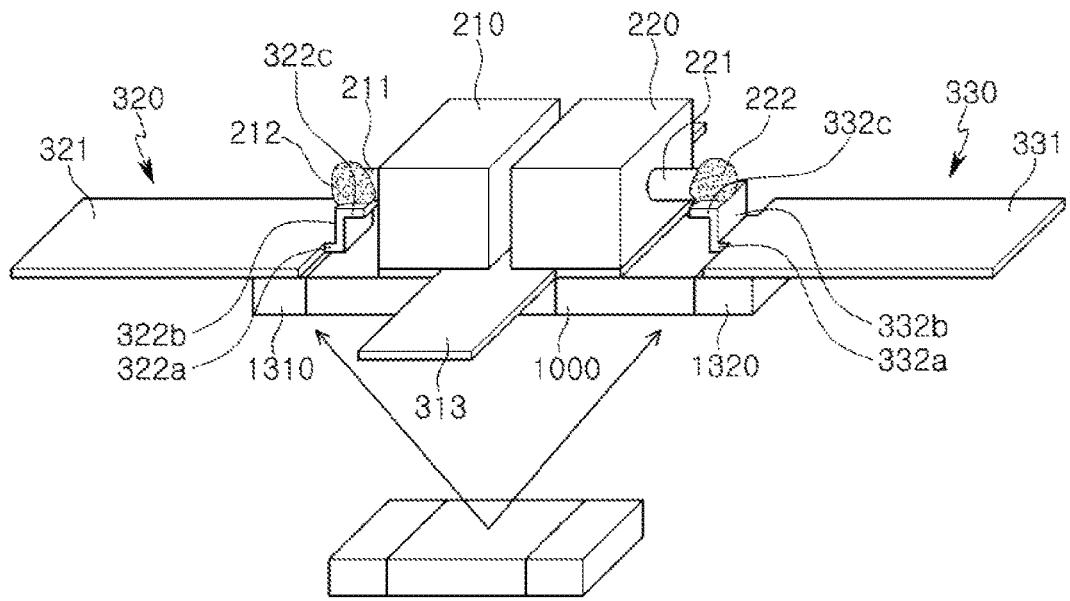

FIG. 7B is a perspective view illustrating a shape of the composite electronic component according to another exemplary embodiment in the present disclosure before a lead frame is bent in a state in which an encapsulation member is not shown; and FIG. 8 is an exploded perspective view illustrating structures of first and second internal electrodes of a body 1000 of the multilayer capacitors shown in FIG. 7B.

Here, since structures of a tantalum capacitor, lead frames, and an encapsulation member are similar to those of the tantalum capacitor, the lead frames, and the encapsulation member according to the exemplary embodiment described above, a detailed description thereof will be omitted in order to avoid an overlapped description, and a multilayer capacitor having a structure different from that of the multilayer capacitor according to the exemplary embodiment described above will be illustrated and be described in detail.

Referring to FIGS. 7B and 8, a body 1000 of first and second multilayer capacitors according to the present exemplary embodiment may include a plurality of dielectric layers 1110 stacked in the thickness direction and first and second internal electrodes 1210 and 1220 disposed to be alternately exposed to third and fourth surfaces of the body 1000 in the length direction with respective dielectric layers 111 interposed therebetween.

In the present exemplary embodiment, first multilayer capacitor includes first and second external electrodes, and second multilayer capacitor includes third and fourth external electrodes, and a third lead frame may serve to electrically connect first and second tantalum bodies 210 and 220, and the second and third external electrodes, to each other.

Board Having Composite Electronic Component

Figure 9:
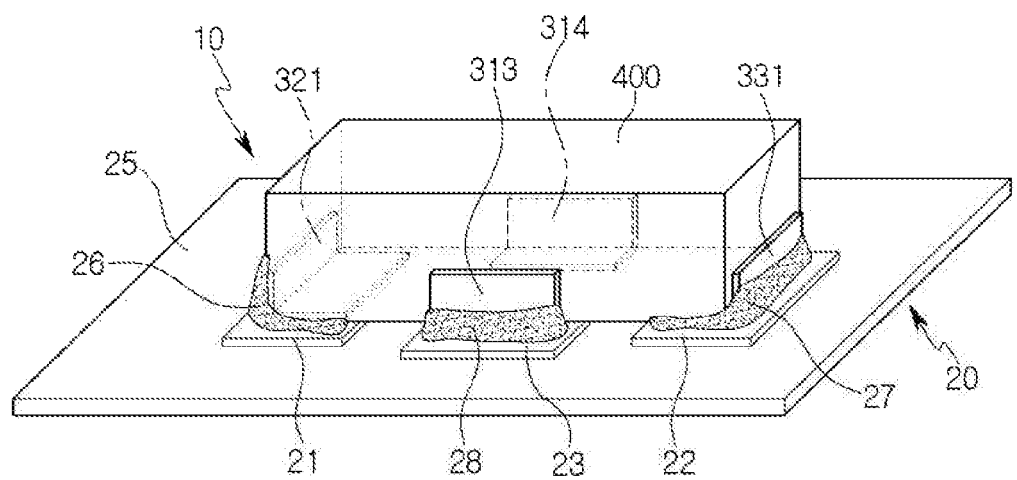
FIG. 9 is a perspective view illustrating a form in which the composite electronic component of FIG. 1 is mounted on a board.
Figure 10:
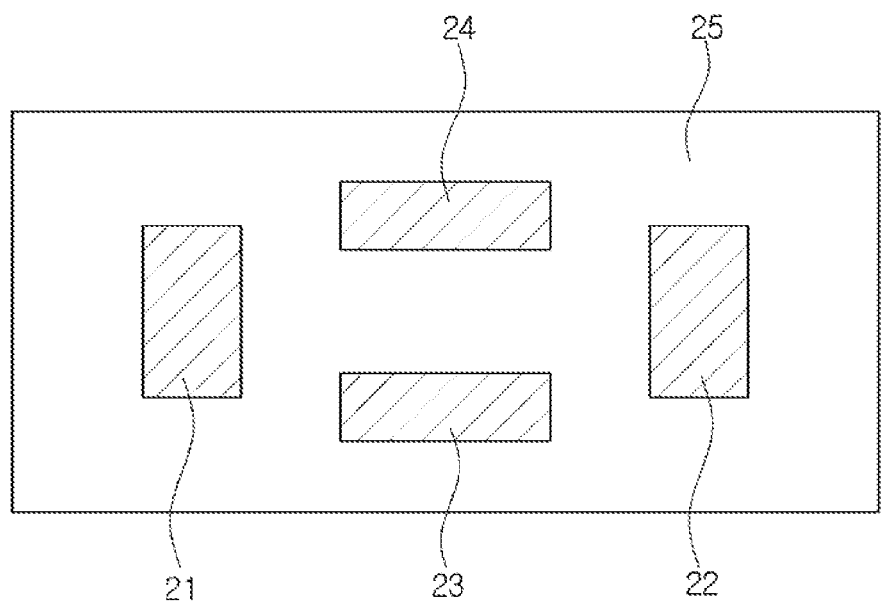
FIG. 10 is a plan view illustrating the board of FIG. 9.

FIG. 9 is a perspective view illustrating a form in which the composite electronic component of FIG. 1 is mounted on a board; and FIG. 10 is a plan view illustrating the board of FIG. 9.

Referring to FIGS. 9 and 10, a board 20 having a composite electronic component according to the present exemplary embodiment may include a substrate 25 on which the composite electronic component 10 is mounted, and first to fourth electrode pads 21 to 24 disposed on an upper surface of the substrate 25 so as to be spaced apart from each other.

Here, the composite electronic component 10 may be electrically connected to the substrate 25 by solders 26 and 27 in a state in which first and second lead frames 321 and 331 are positioned on the first and second electrode pads 21 and 22 so as to contact the first and second electrode pads 21 and 22, respectively, and may be electrically connected to the substrate 25 by a solder 28 and another solder (not shown) in a state in which both end portions 313 and 314 of a third lead frame are positioned on the third and fourth electrode pads 23 and 24 so as to contact the third and fourth electrode pads 23 and 24, respectively.

As set forth above, according to an exemplary embodiment in the present disclosure, a composite electronic component having DC-bias characteristics and stable temperature characteristics, having low ESL and low ESR values, and a decreased high frequency inductance, and a board having the same may be provided.

While exemplary embodiments have been shown and described above, it will be apparent to those skilled in the art that modifications and variations could be made without departing from the scope of the present invention as defined by the appended claims.

What is claimed is:

1. A composite electronic component comprising:
a multilayer capacitor including a body, first and second external electrodes disposed on first and second surfaces of the body in a length direction, respectively, and third and fourth external electrodes disposed on first and second surfaces of the body in a width direction, respectively;
a tantalum capacitor disposed above the multilayer capacitor and including a tantalum body and a tantalum wire of which a portion is embedded in the tantalum body;
a lead frame disposed between the multilayer capacitor and the tantalum capacitor and electrically connecting the multilayer capacitor and the tantalum capacitor to each other; and
an encapsulation member encapsulating the multilayer capacitor and the tantalum capacitor so that a portion of the lead frame is exposed,
wherein the lead frame includes first and second lead frames connected to the first and second external electrodes, respectively, and a third lead frame connecting the third and fourth external electrodes to each other.

2. The composite electronic component of claim 1, wherein the body of the multilayer capacitor includes a plurality of dielectric layers stacked in a thickness direction and first and second internal electrodes alternately disposed with respective dielectric layers interposed therebetween, the first internal electrodes being exposed through the first and second surfaces of the body in the length direction and the second internal electrodes being exposed through the first and second surfaces of the body in the width direction.

3. The composite electronic component of claim 1, wherein the first and second external electrodes extend from the first and second surfaces of the body in the length direction onto a portion of a surface of the body in a thickness direction, respectively, and the third and fourth external electrodes extend from the first and second surfaces of the body in the width direction onto a portion of a surface of the body in the thickness direction, respectively.

4. The composite electronic component of claim 1, wherein first and second tantalum wires of the tantalum capacitor protrude in opposing directions, so as to be connected to the first and second lead frames, respectively, and the tantalum body of the tantalum capacitor is mounted on the third lead frame.

5. The composite electronic component of claim 4, wherein the tantalum body includes first and second tantalum bodies spaced apart from each other in the length direction of the multilayer capacitor, and the first and second tantalum wires protrude through surfaces of the first and second tantalum bodies opposing each other in the length direction, respectively.

6. The composite electronic component of claim 4, wherein first and second connection portions are formed at end portions of the first and second lead frames opposing each other so as to be connected to the first and second tantalum wires, respectively.

7. The composite electronic component of claim 1, wherein the lead frame includes first and second lead frames connected to the first and second external electrodes, respectively, and a third lead frame connecting the third and fourth external electrodes to each other,
the tantalum body includes first and second tantalum bodies disposed to be spaced apart from each other in the length direction of the multilayer capacitor and mounted on the first and second lead frames, respectively, and
first and second tantalum wires protrude through surfaces of the first and second tantalum bodies facing each other in the length direction, respectively.

8. The composite electronic component of claim 7, wherein third and fourth connection portions are formed on the third lead frame so as to be connected to the first and second tantalum wires, respectively.

9. A composite electronic component comprising:
a multilayer capacitor including a body and first and second external electrodes disposed on first and second surfaces of the body in a length direction, respectively;
a tantalum capacitor disposed above the multilayer capacitor and including a tantalum body and a tantalum wire of which a portion is embedded in the tantalum body;
a lead frame disposed between the multilayer capacitor and the tantalum capacitor and electrically connecting the multilayer capacitor and the tantalum capacitor to each other; and
an encapsulation member encapsulating the multilayer capacitor and the tantalum capacitor so that a portion of the lead frame is exposed,
wherein the body of the multilayer capacitor includes a plurality of dielectric layers stacked in a thickness direction and first and second internal electrodes disposed to be alternately exposed through first and second surfaces of the body in the length direction with respective dielectric layers interposed therebetween, and
the lead frame includes first and second lead frames connected to the first and second external electrodes, respectively, and a third lead frame
the tantalum body includes a first and second tantalum bodies disposed to be spaced apart from each other in a length direction of the multilayer capacitor and mounted on the first and second lead frames, respectively, and
the third lead frame connecting the first and second tantalum bodies to each other.

10. A composite electronic component comprising:
a first multilayer capacitor including a body and first and second external electrodes disposed on first and second surfaces of the body in a length direction, respectively;

a second multilayer capacitor including a body and third and fourth external electrodes disposed on first and second surfaces of the body in a length direction, respectively;
a tantalum capacitor disposed above the first and second multilayer capacitors and including a tantalum body and a tantalum wire of which a portion is embedded in the tantalum body;
a lead frame disposed between the first and second multilayer capacitors and the tantalum capacitor and electrically connecting the first and second multilayer capacitors and the tantalum capacitor to each other; and
an encapsulation member encapsulating the first and second multilayer capacitors and the tantalum capacitor so that a portion of the lead frame is exposed,
wherein the lead frame includes first and second lead frames connected to the first and fourth external electrodes, respectively, and a third lead frame connecting the second and third external electrodes to each other.

11. The composite electronic component of claim 10, wherein the bodies of the first and second multilayer capacitors each include a plurality of dielectric layers stacked in a thickness direction and first and second internal electrodes disposed to be alternately exposed through first and second surfaces of the body in the length direction with respective dielectric layers interposed therebetween.

12. The composite electronic component of claim 10, wherein first and second tantalum wires of the tantalum capacitor protrude in opposing directions, so as to be connected to the first and second lead frames, respectively, and the tantalum body of the tantalum capacitor is mounted on the third lead frame.

13. The composite electronic component of claim 12, wherein first and second connection portions are formed at end portions of the first and second lead frames opposing each other so as to be connected to the first and second tantalum wires, respectively.

14. The composite electronic component of claim 10, wherein the tantalum body includes first and second tantalum bodies spaced apart from each other in the length direction of the first and second multilayer capacitors, and the first and second tantalum wires protrude through surfaces of the first and second tantalum bodies opposing each other in the length direction, respectively.

15. The composite electronic component of claim 1, wherein terminal electrodes are formed on the lead frame exposed to the exterior of the encapsulation member, and have a vertically symmetrical structure.

16. A board having a composite electronic component, comprising:
a substrate having a plurality of electrode pads disposed on an upper surface thereof; and
the composite electronic component of claim 1 of which the lead frame is mounted on the electrode pads.

17. The board of claim 16, wherein the composite electronic component is oriented such that the tantalum capacitor is disposed to be between the board and the multilayer capacitor.

* * * * *